United States Patent
Li et al.

(10) Patent No.: US 6,924,202 B2
(45) Date of Patent: Aug. 2, 2005

(54) HETEROJUNCTION BIPOLAR TRANSISTOR WITH SELF-ALIGNED EMITTER AND SIDEWALL BASE CONTACT

(75) Inventors: Jian Xun Li, Singapore (SG); Lap Chan, Singapore (SG); Purakh Raj Verma, Singapore (SG); Jia Zhen Zheng, Singapore (SG); Shao-fu Sanford Chu, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 91 days.

(21) Appl. No.: 10/683,142

(22) Filed: Oct. 9, 2003

(65) Prior Publication Data

US 2005/0079658 A1 Apr. 14, 2005

(51) Int. Cl.[7] ............................................. H01L 21/331
(52) U.S. Cl. ..................... 438/312; 438/320; 438/348; 438/350; 438/366; 257/183; 257/200; 257/592
(58) Field of Search ................................. 438/312, 320, 438/345, 348, 350, 365, 366; 257/183, 197, 200, 592

(56) References Cited

U.S. PATENT DOCUMENTS

| | | | | |
|---|---|---|---|---|
| 5,315,151 A | * | 5/1994 | Hsieh et al. ................. | 257/592 |
| 5,498,567 A | * | 3/1996 | Klose et al. ................. | 438/151 |
| 5,773,350 A | * | 6/1998 | Herbert et al. .............. | 438/364 |
| 5,897,359 A | * | 4/1999 | Cho et al. .................... | 438/312 |
| 6,169,007 B1 | * | 1/2001 | Pinter .......................... | 438/320 |
| 6,664,574 B2 | * | 12/2003 | Azam et al. ................. | 257/197 |
| 6,861,323 B2 | * | 3/2005 | Shideler ...................... | 438/309 |

* cited by examiner

Primary Examiner—Trung Dang
(74) Attorney, Agent, or Firm—Mikio Ishimaru (57) ABSTRACT

A heterojunction bipolar transistor (HBT), and manufacturing method therfor, comprising a semiconductor substrate having a collector region is provided. A base contact layer is formed over the collector region, and a base trench is formed in the base contact layer and the collector region. An intrinsic base structure having a sidewall portion and a bottom portion is formed in the base trench. An insulating spacer is formed over the sidewall portion of the intrinsic base structure, and an emitter structure is formed over the insulating spacer and the bottom portion of the intrinsic base structure. An interlevel dielectric layer is formed over the base contact layer and the emitter structure. Connections are formed through the interlevel dielectric layer to the collector region, the base contact layer, and the emitter structure. The intrinsic base structure is silicon and at least one of silicon-germanium, silicon-germanium-carbon, and combinations thereof.

20 Claims, 5 Drawing Sheets

HETEROJUNCTION BIPOLAR TRANSISTOR WITH SELF-ALIGNED EMITTER AND SIDEWALL BASE CONTACT

BACKGROUND

1. Technical Field

The present invention relates generally to semiconductor technology and more specifically to heterojunction bipolar transistors and manufacturing methods therefor.

2. Background Art

Advancements in manufacturing transistors with compound semiconductive materials have created a renewed interest in the use of bipolar junction transistors (BJTs). A bipolar junction transistor (BJT) is a three-terminal device that can controllably vary the magnitude of the electrical current that flows between two of the terminals. The three terminals include a base terminal, a collector terminal, and an emitter terminal. The movement of electrical charge carriers, which produce electrical current flow between the collector and the emitter terminals varies dependent upon variations in the voltage on the base terminal thereby causing the magnitude of the current to vary. Thus, the voltage across the base and emitter terminals controls the current flow through the emitter and collector terminals.

The terminals of a BJT are connected to their respective base, collector and emitter structures formed in a semiconductor substrate. BJTs comprise two p-n junctions placed back-to-back in close proximity to each other, with one of the regions common to both junctions. There is a first junction between the base and the emitter, and a second junction between the emitter and the collector. This forms either a p-n-p or n-p-n transistor depending upon the characteristics of the semiconductive materials used to form the HBT.

Recently, demand for BJTs has increased significantly because these transistors are capable of operating at higher speeds and driving more current. These characteristics are important for high-speed, high-frequency communication networks such as those required by cell phones and computers.

BJTs can be used to provide linear voltage and current amplification because small variations of the voltage between the base and emitter terminals, and hence the base current, result in large variations of the current and voltage output at the collector terminal. The transistor can also be used as a switch in digital logic and power switching applications. Such BJTs find application in analog and digital circuits and integrated circuits at all frequencies from audio to radio frequency.

Heterojunction bipolar transistors (HBTs) are BJTs where the emitter-base junction is formed from two different semiconductive materials having similar characteristics. One material used in forming the base-emitter junction preferably is a compound semiconductive material such as silicon (Si) and silicon-germanium (SiGe), or silicon-germanium-carbon (SiGeC), or a combination thereof. HBTs using compound semiconductive materials have risen in popularity due to their high-speed and low electrical noise capabilities, coupled with the ability to manufacture them using processing capabilities used in the manufacture of silicon BJTs. HBTs have found use in higher-frequency applications such as cell phones, optical fiber, and other high-frequency applications requiring faster switching transistors, such as satellite communication devices.

Most BJTs, including HBTs, in use today are "double poly" bipolar transistors, which use two polysilicon structures; one for an emitter structure, and a second for a base structure of the transistor.

HBTs are manufactured by implanting a silicon substrate with a dopant to provide a collector region. A silicon layer is then grown or formed over the collector region. Insulating dividers called shallow-trench isolations (STIs) are formed in the silicon substrate. The STIs define an intrinsic base region over a portion of the collector region.

Subsequently, a first layer of polysilicon is formed over the silicon substrate and is processed to form a base structure in contact with a portion of the intrinsic base region. One portion of the base structure is formed with an opening in which an emitter structure is subsequently formed.

A first insulating layer is formed over the base structure and is removed in the opening of the base structure over the intrinsic base region by etching down to the intrinsic base region to form an emitter window. The etching process inherently produces a rough surface on the substrate since the etchants used are not particularly selective between the polysilicon layer forming the base structure and the underlying silicon substrate. To get higher performance, compound semiconductive materials such as SiGe and SiGeC generally are grown over the insulating layer and on the rough surface of the substrate. The rough surface causes a major problem because the growth of the compound semiconductive material is irregular and its thickness is not constant as a result of the roughness of the substrate. This leads to performance problems with the device and variations in performance from device to device.

A second layer of polysilicon is formed into the emitter window and processed to form an emitter structure, which is encircled by and overlaps the base structure. The overlap is necessary to provide room for an emitter contact, but it causes another major problem with unwanted capacitance between the emitter and base structures. This capacitance slows down the operation of the HBT.

A dielectric layer is formed over the emitter structure and is processed to form spacers around the emitter structure. An interlevel dielectric layer (ILD) is then formed over the emitter and base structures.

Finally, contacts are formed in the ILD that connect with the collector, base, and emitter structures. Terminals are then connected to the contacts.

As previously mentioned, the emitter structure overlaps the base structure because it is necessary to provide room for the emitter contact to be formed. Since it is desirable to make the overlap as small as possible, it is desirable to have the emitter structure as small as possible. However, variations in the size of the emitter contact lead to a further major problem causing performance variations in the HBT from device to device.

Although the use of compound semiconductive materials has proven useful in HBTs, once formed by existing methods, this material is subsequently subjected to multiple thermal cycles, implantations and/or etching processes during the formation steps of the remaining elements of the HBT. Such steps include the deposition and etching of oxide layers, nitride layers and subsequently formed polysilicon layers. Several of these processing steps inherently damage the compound semiconductive material. Etching polysilicon over a compound semiconductive layer, for example, adversely affects the compound semiconductive material because the etchants used do not selectively etch only the polysilicon. Some of the compound semiconductive material is also etched during this processing step, resulting in HBTs that are relatively slower and exhibit relatively poor noise performance compared to other HBTs on the same semiconductor wafer.

One attempt to overcome the above-mentioned problems involves selective epitaxial growth of the compound semiconductive material only over the active region of the HBT to form a self-aligned epitaxial intrinsic base structure. Selective epitaxy also may be used in a self-aligned emitter-to-base process in which an emitter window is defined by growing an in situ doped epitaxial lateral over a patterned thin oxide/nitride pad.

In one method for fabricating a self-aligned double-polysilicon HBT using selective epitaxy, the intrinsic base is implanted in the silicon substrate only in the active region of the silicon substrate. A polysilicon layer heavily doped with a dopant of a conductivity type opposite that of the substrate is formed over the active region of the semiconductor substrate having a given conductivity type.

For example, an n-doped silicon substrate would have p-doped polysilicon layers formed thereon. This polysilicon layer then has one or more compound semiconductive layers epitaxially grown over it. These layers are then covered with an upper insulating layer, for example silicon dioxide to form a stack above the active region of the HBT. The polysilicon layers are intended to eventually form the extrinsic base structure of the HBT. The stack is then etched to define an emitter window. Electrically insulating regions or "reverse spacers" are separately made on the sidewalls of the emitter window. Next, polysilicon is formed in the emitter window to form the emitter structure. The emitter structure is thus insulated from the extrinsic base structure by the reverse spacers and by a portion of the upper insulating layer of the stack on which the emitter structure partially rests. This results in a more consistently small-sized emitter structure.

The adverse effects of etching the emitter window still persist however. During the operation of etching the stack, over-etching still occurs. The lack of adequate controls and reproducibility of over-etching typically results in the intrinsic base being implanted after formation of the emitter window. Implantation on the over-etched surface does not overcome the problems associated with the over-etched surface.

Furthermore, to improve the operating speed of a HBT, it is important that the base structure be thin enough to minimize the time it takes electronic charges to move from the emitter to the collector, thereby minimizing the response time of the HBT. It is also important, however, that the base structure have a high concentration of dopant in order to minimize base resistance. Typically, ion implantation techniques are used to form a base layer. However, this technique has the problem of ion channeling, which limits the minimum thickness of the base layer. Another disadvantage of ion implantation is that the compound semiconductive layer is often damaged by the ions during implantation.

Additionally, high-temperature annealing typically is required to drive dopants into the various material layers. This annealing step, however, alters the profile of concentration levels of the dopants within the various layers of semiconductive materials forming the transistor to create undesirable dopant profiles within the various material layers.

Existing methods of manufacturing HBTs still have the problems associated with over-etching, the detrimental effects of ion implantation and annealing, and consistency of manufacturability.

Additionally, existing manufacturing processes for HBTs are complicated, and have relatively high emitter-base capacitance due to the emitter structure overlapping the extrinsic base structure.

Solutions to these problems have been long sought but prior developments have not taught or suggested any acceptable solutions and, thus, solutions to these problems have long eluded those skilled in the art.

DISCLOSURE OF THE INVENTION

The present invention provides a heterojunction bipolar transistor and a method of manufacture therefor, comprising a semiconductor substrate having a collector region. A base contact layer is formed over the collector region, and a base trench is formed in the base contact layer and the collector region. An intrinsic base structure having a sidewall portion and a bottom portion is formed in the base trench. An insulating spacer is formed over the sidewall portion of the intrinsic base structure, and an emitter structure is formed over the spacer and the bottom portion of the intrinsic base structure. An interlevel dielectric layer is formed over the base contact layer and the emitter structure. Connections are formed through the interlevel dielectric layer to the collector region, the base contact layer, and the emitter structure. The HBT thus manufactured has an improved response time and minimized base resistance.

Emitter-base capacitance also is reduced thereby improving performance of the HBT. The present method also is simpler than conventional manufacturing techniques.

DETAILED DESCRIPTION OF THE INVENTION

In the following description, numerous specific details are given to provide a thorough understanding of the invention. However, it will be apparent to one skilled in the art that the invention may be practiced without these specific details. In order to avoid obscuring the present invention, some well-known system configurations, and process steps are not disclosed in detail.

Likewise, the drawings showing embodiments of the apparatus are semi-diagrammatic and not to scale and, particularly, some of the dimensions are for the clarity of presentation and are shown greatly exaggerated in the FIGs. Generally, the device can be operated in any orientation.

The term "horizontal" as used in herein is defined as a plane parallel to the conventional plane or surface of a wafer or substrate, regardless of its orientation. The term "vertical" refers to a direction perpendicular to the horizontal as just defined. Terms, such as "on", "above", "below", "side" (as in "sidewall"), "higher", "lower", "over", "bottom", and "under", are defined with respect to the horizontal plane. The term "beside" refers to two structures, which are side by side with neither overlapping the other.

The term "processing", or "processed" as used herein includes deposition of material or photoresist, patterning, exposure, development, etching, cleaning, and/or removal of the material or photoresist as required in forming a described structure.

The term "conductivity type" as used herein refers to a semiconductive material that uses either electrons as the primary carrier of electrical charge, on one hand, or holes as the primary carrier of electrical charge, on the other hand.

Figure 1:
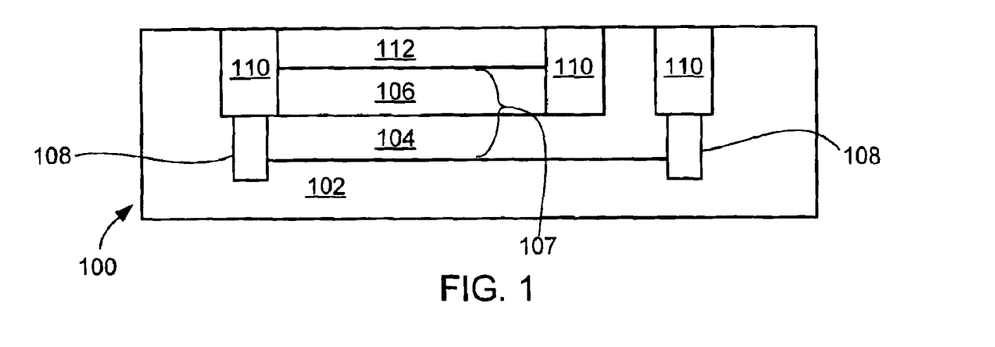
FIG. 1 is a partial cross-sectional view of a HBT in an intermediate stage of manufacture in accordance with the present invention.

Referring now to FIG. 1, therein is shown a partial cross-sectional view of a HBT100 in an intermediate stage of manufacture in accordance with the present invention. The HBT100 includes a semiconductor substrate 102 having a buried collector region 104, and a sub-collector region 106. Together the buried collector region 104 and the sub-collector region 106 will be referred to as a collector region 107.

The semiconductor substrate 102 also has a number of deep trench isolations (DTIs) 108 and a number of shallow trench isolations (STIs) 110. The number of DTIs 108 and the number of STIs 110 are formed, for example, by etching trenches in the semiconductor substrate 102, and then forming an insulating layer, such as an oxide layer, into the trenches to form the DTI 108 and the STIs 110.

The semiconductor substrate 102 is a lightly doped semiconductive material of a first conductivity type, such as a $p^-$ doped silicon. The buried collector region is a heavily doped semiconductive material of a second conductivity type, such as an $n^+$ doped silicon. The sub-collector region is a lightly doped semiconductive material of the second type, such as an $n^-$ doped silicon.

Above the sub-collector region 106 is formed a base contact layer 112. The base contact layer 112 is formed by implanting a dopant into the semiconductor substrate 102 above the sub-collector region 106. The dopant used forms the base contact layer 112, which is a heavily doped semiconductive material of the first conductivity type, such as $p^+$ silicon. For example, boron ions can be implanted above the sub-collector region 106 to form the base contact layer 112.

Figure 2:
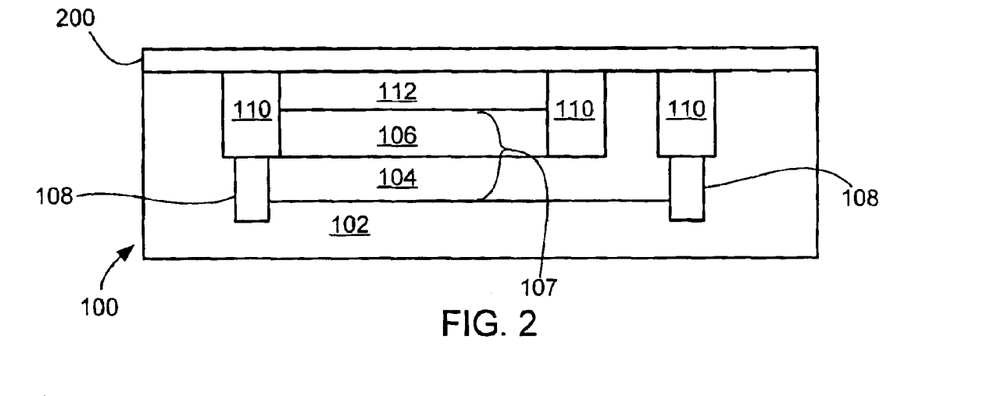
FIG. 2 is the structure of FIG. 1 after deposition of an insulating layer.

Referring now to FIG. 2, therein is shown the structure of FIG. 1 after deposition of a first insulating layer 200, such as a nitride layer. The first insulating layer 200 is formed over the semiconductor substrate 102 to cover the number of STI's 110, the base contact layer 112, and the remaining portions of the semiconductor substrate 102. The first insulating layer 200 can be planarized using a chemical mechanical polishing (CMP) process.

Figure 3:
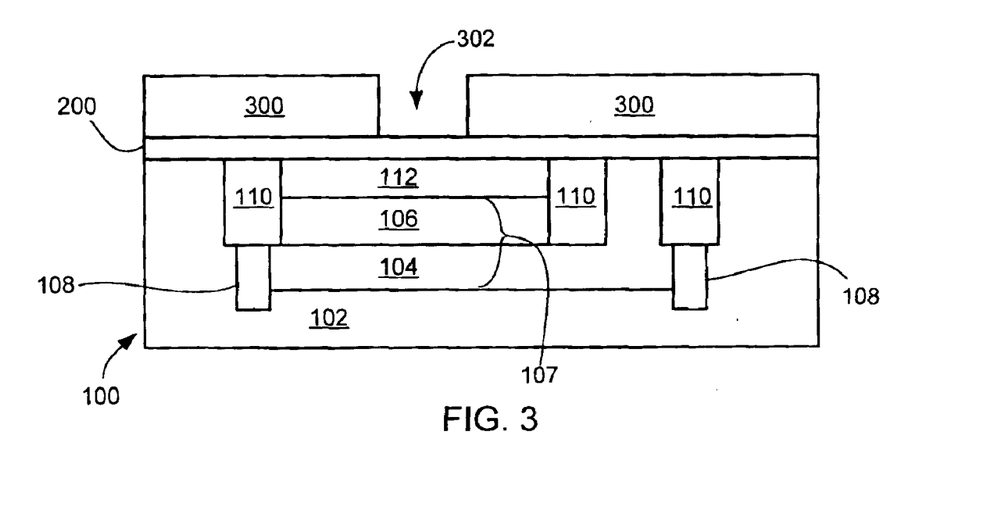
FIG. 3 is the structure of FIG. 2 after deposition and patterning of a photoresist layer.

Referring now to FIG. 3, therein is shown the structure of FIG. 2 after application of a photoresist layer 300. The photoresist layer 300 has been applied, masked, and exposed to form a window 302 to the first insulating layer 200 over the base contact layer 112.

Figure 4:
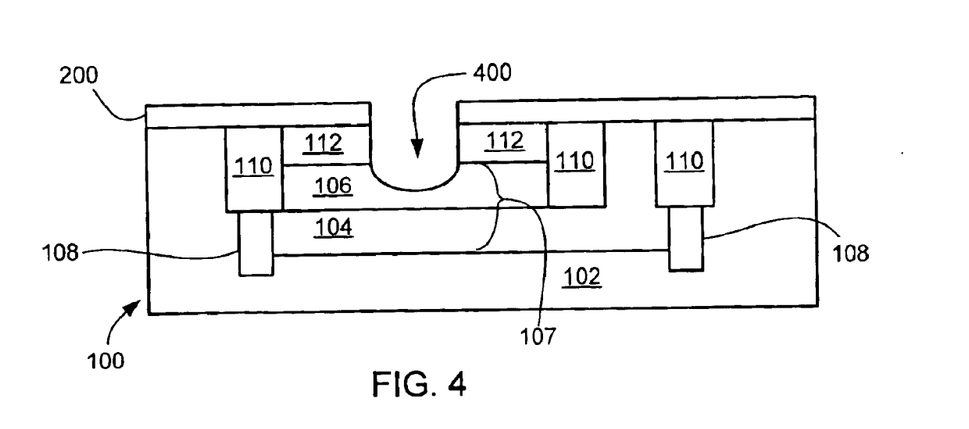
FIG. 4 is the structure of FIG. 3 after formation of a base trench in the collector region.

Referring now to FIG. 4, therein is shown the structure of FIG. 3 after formation of a base trench 400. The base trench 400 is formed by etching the first insulating layer 200 that was under the window 302 shown in FIG. 3. The base contact layer 112 is etched with a silicon etchant to form the base trench 400. Etching of the base trench 400 is stopped in the sub-collector region 106. Preferably, the base trench 400 has rounded corners in accordance with readily available manufacturing processes to avoid sharp corners thereby reducing stress and leakage in the HBT 100. After the etching process, the photoresist layer 300 shown in FIG. 3 is stripped and the surface is cleaned using conventional semiconductor processing techniques.

Figure 5:
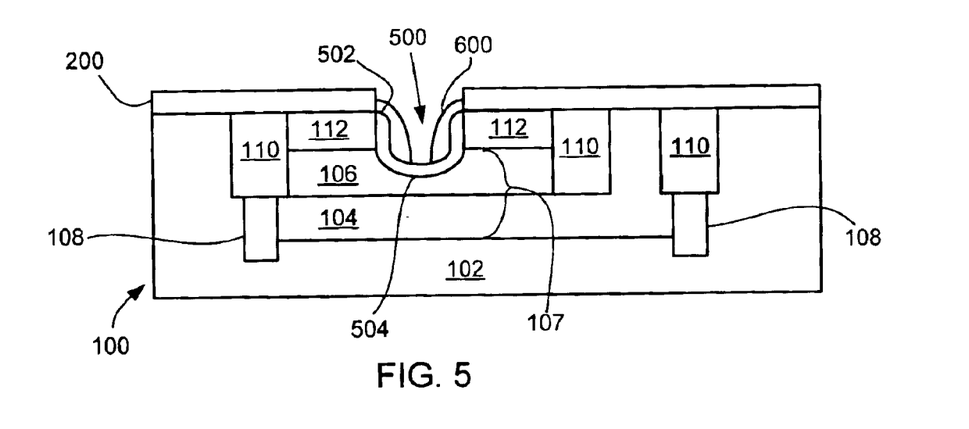
FIG. 5 is the structure of FIG. 4 after formation of intrinsic base structure in the base trench.

Referring now to FIG. 5, therein is shown the structure of FIG. 4 after formation of an intrinsic base structure 500 in the base trench 400. The intrinsic base structure 500 is formed, for example, by selectively depositing or growing an epitaxial layer of a compound semiconductive material in the base trench 400. The intrinsic base structure 500 is formed on the portion of the base trench 400 that comes into contact with the sub-collector region 106 and the base contact layer 112 that had been etched to form the base trench 400. The intrinsic base structure 500 has a sidewall portion 502 and a bottom portion 504. The intrinsic base structure 500 is preferably a compound semiconductive material of silicon and at least one of silicon-germanium (Si/SiGe), silicon-germanium-carbon (SiGeC), and combinations thereof. The intrinsic base structure 500, for example, is lightly doped with the same dopant used to form the base contact layer 112, so the intrinsic base structure 500 is a lightly doped compound semiconductive material of the first conductivity type, such as $p^-$ doped polysilicon.

Figure 6:
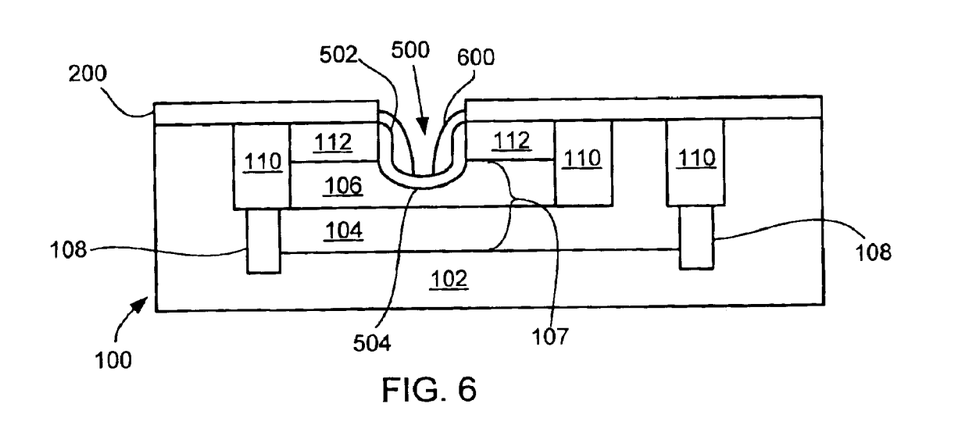
FIG. 6 is the structure of FIG. 5 after formation of an insulating spacer over the sidewall portion of the intrinsic base structure.

Referring now to FIG. 6, therein is shown the structure of FIG. 5 after formation of an insulating spacer 600 over the sidewall portion 502 of the intrinsic base structure 500. The insulating spacer 600 is formed, for example, by depositing an insulating material, such as an oxide or nitride, over the intrinsic base structure 500 and then performing an anisotropic etching process to form the insulating spacer 600. At least a part of the bottom portion 504 of the intrinsic base structure 500 is uncovered by the formation of the insulating spacer 600.

Figure 7:
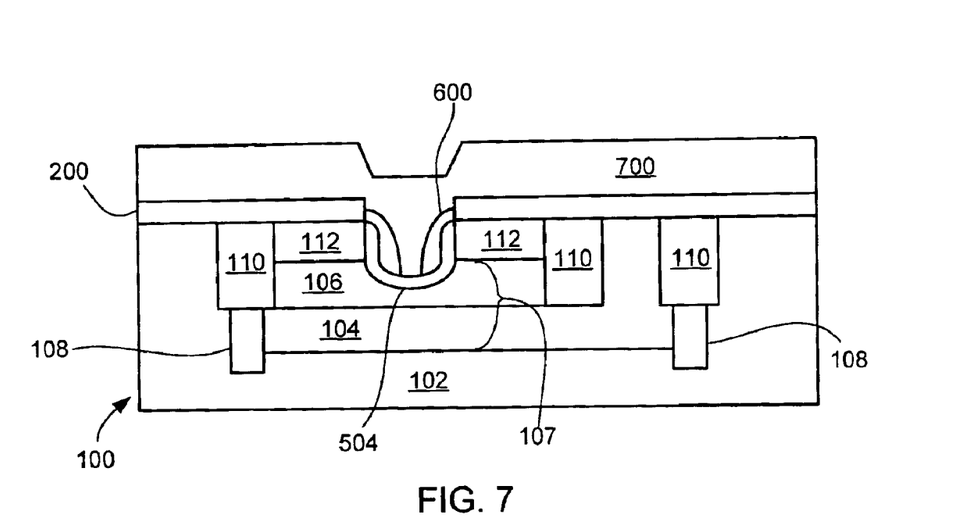
FIG. 7 is the structure of FIG. 6 after deposition of a polysilicon layer.

Referring now to FIG. 7, therein is shown the structure of FIG. 6 after deposition of a polysilicon layer 700. The polysilicon layer 700 is formed over the first insulating layer 200 and into the base trench 400 covering the insulating spacer 600. The polysilicon layer 700, for example, is heavily doped semiconductive material of the second conductivity type, such as $n^+$ doped polysilicon. The polysilicon layer 700 can be doped using an ion implantation process, or pre-doped during the deposition process.

Figure 8:
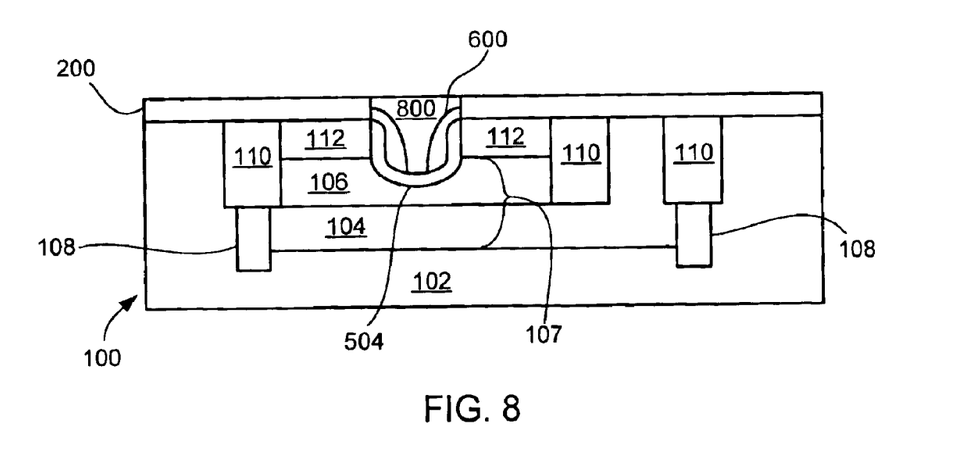
FIG. 8 is the structure of FIG. 7 after processing the polysilicon layer to form an emitter structure.

Referring now to FIG. 8, therein is shown the structure of FIG. 7 after the polysilicon layer 700 of FIG. 7 has been processed to form an emitter structure 800. The polysilicon layer 700 has been processed using a chemical mechanical polishing (CMP) process, which stops on the first insulating layer 200. The remaining portion of the base trench 400 is thereby filled with the polysilicon layer 700. The portion of the polysilicon layer 700 that remains after the CMP process forms the emitter structure 800. Since the emitter structure 800 is confined to the area of the base trench 400 and does not overlap the extrinsic base structure 112, emitter-base capacitance is reduced resulting in increased performance of the HBT 100.

Figure 9:
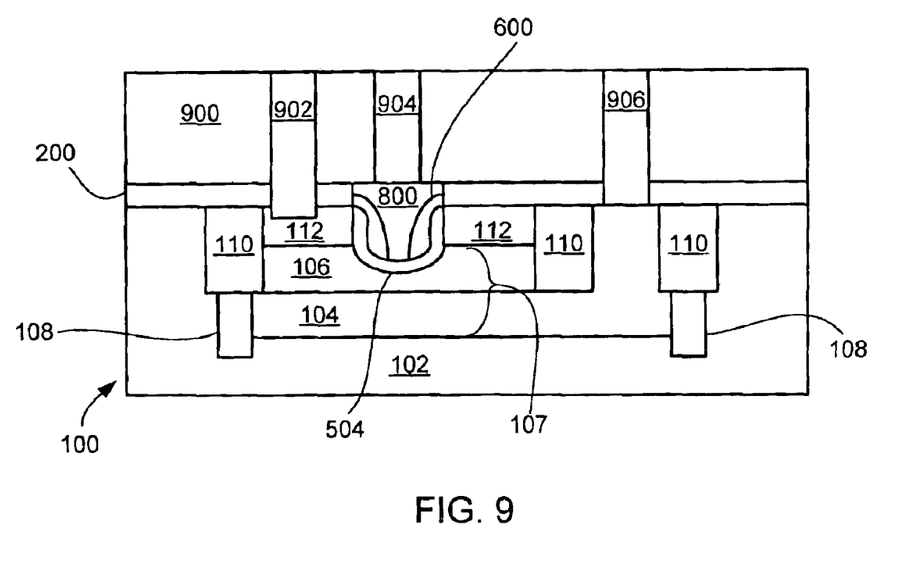
FIG. 9 is the structure of FIG. 8 after formation of an interlevel dielectric layer.

Referring now to FIG. 9, therein is shown the structure of FIG. 8 after formation of an interlevel dielectric (ILD) layer 900. The ILD layer 900 is formed over the surface of the structure of FIG. 8 and then patterned and etched to form a base contact window 902, an emitter contact window 904, and a collector contact window 906.

Figure 10:
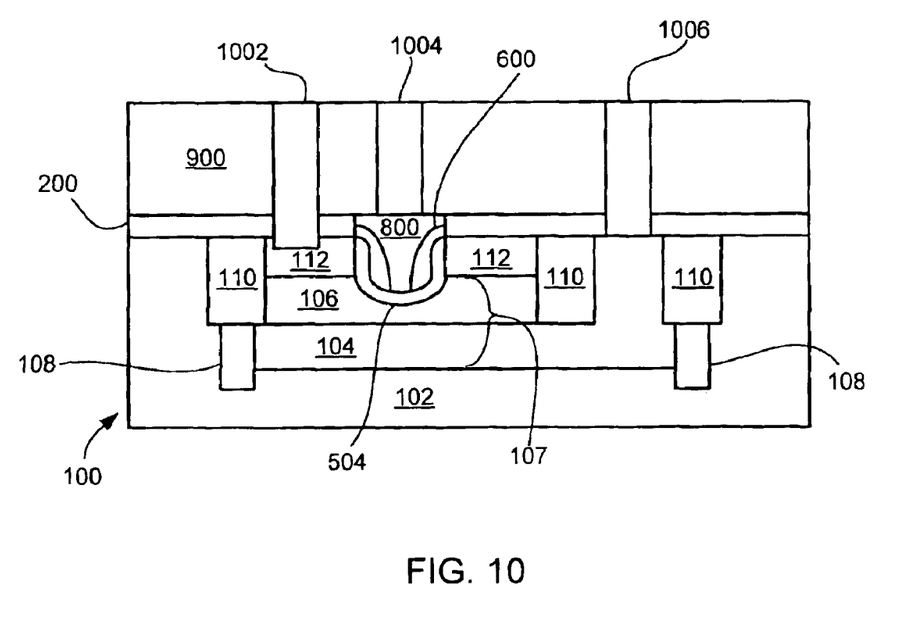
FIG. 10 is the structure of FIG. 9 after formation of a number of contacts in the interlevel dielectric layer.

Referring now to FIG. 10, therein is shown the structure of FIG. 9 after formation of a number of contacts in the ILD layer 900. A base contact 1002, an emitter contact 1004, and a collector contact 1006 are formed in the ILD layer 900 by filling the base contact window 902, the emitter contact window 904 and the collector contact window 906 with a suitable contact material such as tungsten to form the base contact 1002, the emitter contact 1004 and the collector contact 1006.

The base contact 1002 is formed through the ILD layer 900 and contacts the base contact layer 112. The emitter contact 1004 is formed through the ILD layer 900 and comes in contact with the emitter structure 800. The collector contact 1006 is formed through the ILD layer 900 to come in contact with the collector region 107.

Figure 11:
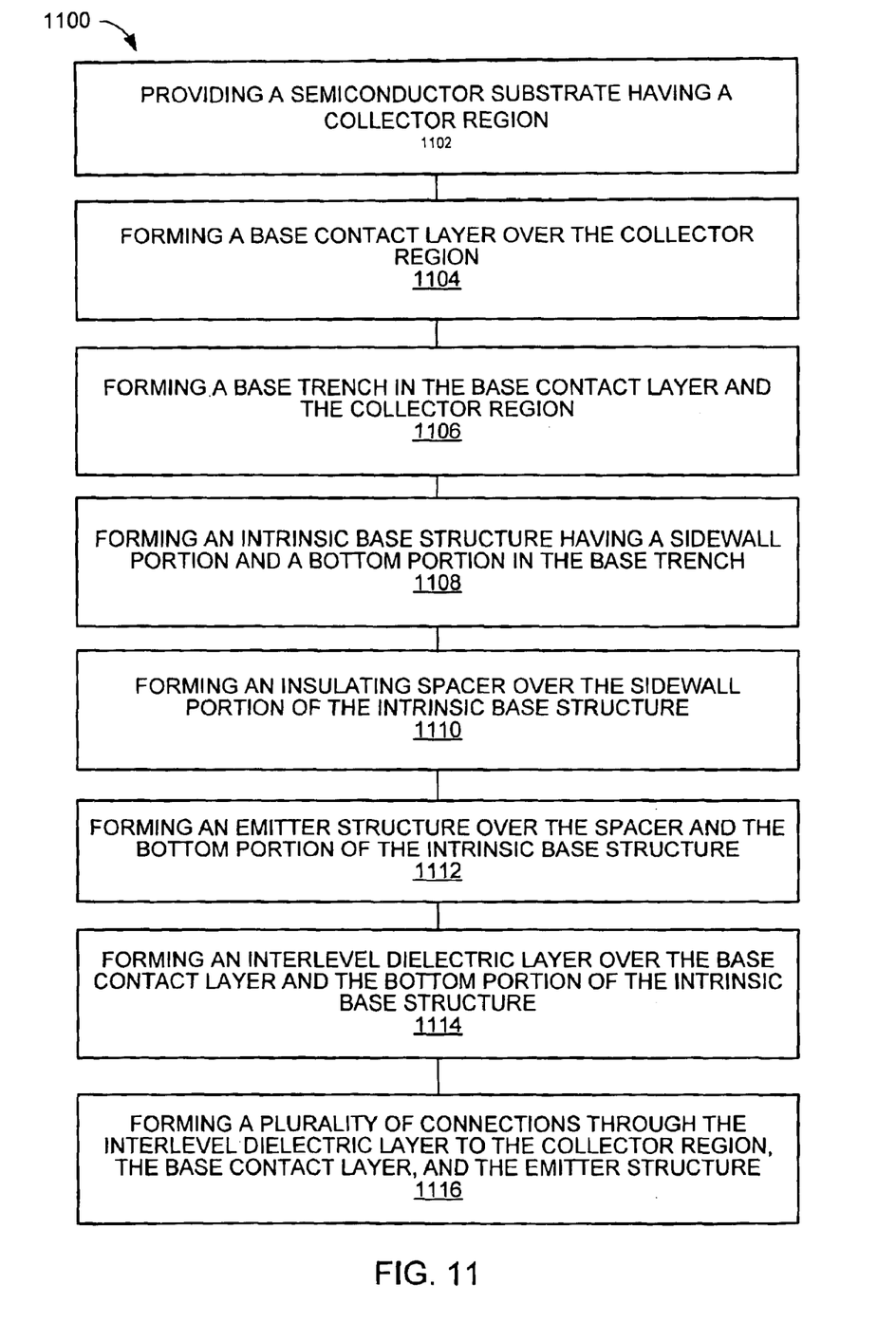
FIG. 11 is a flow chart of a method of the present invention.

Referring now to FIG. 11, therein is shown a flow chart of a method 1100 of the present invention. The method 1100 of the present invention comprises a step 1102 of providing a semiconductor substrate having a collector region; a step 1104 of forming a base contact layer over the collector region; a step 1106 of forming a base trench in the base contact layer and the collector region; a step 1108 of forming an intrinsic base structure having a sidewall portion and a bottom portion in the base trench; a step 1110 of forming an insulating spacer over the sidewall portion of the intrinsic base structure; a step 1112 of forming an emitter structure over the spacer and the bottom portion of the intrinsic base structure; a step 1114 of forming an interlevel dielectric layer over the base contact layer and the emitter structure; and a step 1116 of forming a number of connections through the interlevel dielectric layer to the collector region, the base contact layer, and the emitter structure.

While the present invention has been described in conjunction with the specific embodiment shown, it is to be understood that many alternatives, modifications, and. variations will be apparent to those skilled in the art in light of the foregoing description. Accordingly, it is intended to embrace all such alternatives, modifications, and variations that fall within the spirit and scope of the included claims. All matters hither-to-fore set forth or shown in the accompanying drawings are to be interpreted in an illustrative and non-limiting sense.

The invention claimed is:

1. A method of manufacturing a heterojunction bipolar transistor comprising:
   providing a semiconductor substrate having a collector region;
   forming a base contact layer over the collector region;
   forming a base trench in the base contact layer and the collector region;
   forming an intrinsic base structure having a sidewall portion and a bottom portion in the base trench;
   forming an insulating spacer over the sidewall portion of the intrinsic base structure;
   forming an emitter structure over the spacer and the bottom portion of the intrinsic base structure;
   forming an interlevel dielectric layer over the base contact layer and the bottom portion of the intrinsic base structure; and
   forming a plurality of connections through the interlevel dielectric layer to the collector region, base contact layer, and the emitter structure.

2. The method as claimed in claim 1 wherein forming the intrinsic base structure forms a compound semiconductive material of silicon and at least one of silicon-germanium, silicon-germanium-carbon, and combinations thereof.

3. The method as claimed in claim 1 wherein providing the semiconductor substrate provides a lightly doped semiconductor substrate of a first conductivity type having a collector region of a second conductivity type.

4. The method as claimed in claim 3 wherein providing the semiconductor substrate having a collector region provides a collector region comprising a heavily doped buried collector region of the second conductivity type and a lightly doped sub-collector region of the second conductivity type.

5. The method as claimed in claim 4 wherein forming the intrinsic base structure forms a compound semiconductive material of silicon and at least one of silicon-germanium, silicon-germanium carbon, and combinations thereof.

6. A method of manufacturing a heterojunction bipolar transistor comprising:
   providing a lightly doped semiconductor substrate of a first conductivity type having a collector region of a second conductivity type;
   forming a base contact layer of a heavily doped semiconductive layer of the first conductivity type over the collector region;
   forming a base trench through the base contact layer and into the collector region;
   forming an intrinsic base structure having a sidewall portion and a bottom portion of a lightly doped compound semiconductive material of the first conductivity type in the base trench;
   forming an insulating spacer over the sidewall portion of the intrinsic base structure;
   forming an emitter structure of a highly doped semiconductive material of the second conductivity type over the insulating spacer and the bottom portion of the intrinsic base structure;
   forming an interlevel dielectric layer over the base contact layer and the emitter structure; and
   forming connections through the interlevel dielectric layer to the collector region, the base contact layer, and the emitter structure.

7. The method as claimed in claim 6 wherein forming the intrinsic base structure forms a compound semiconductive material of silicon and at least one of silicon-germanium, silicon-germanium-carbon, and combinations thereof.

8. The method as claimed in claim 6 wherein providing the collector region provides a heavily doped buried collector region of the second conductivity type and a lightly doped sub-collector region of the second conductivity type.

9. The method as claimed in claim 8 wherein forming the base trench into the collector region forms a base trench into the sub-collector region.

10. The method as claimed in claim 6 wherein forming the intrinsic base structure forms a compound semiconductive material of silicon and at least one of silicon-germanium, silicon-germanium-carbon, and combinations thereof.

11. A heterojunction bipolar transistor comprising:
   a semiconductor substrate having a collector region;
   a base contact layer over the collector region;
   the base contact layer and the collector region having a base trench therein;
   an intrinsic base structure having a sidewall portion and a bottom portion in the base trench;
   an insulating spacer over the sidewall portion of the intrinsic base structure;

an emitter structure over the insulating spacer and the bottom portion of the intrinsic base structure;

an interlevel dielectric layer over the base contact layer and the bottom portion of the intrinsic base structure; and connections through the interlevel dielectric layer to the collector region, the base contact layer, and the emitter structure.

12. The heterojunction bipolar transistor as claimed in claim 11 wherein the intrinsic base structure comprises a compound semiconductive material of silicon and at least one of silicon-germanium, silicon-germanium-carbon, and combinations thereof.

13. The heterojunction bipolar transistor as claimed in claim 11 wherein the semiconductor substrate comprises a lightly doped semiconductor substrate of a first conductivity type having a collector region of a second conductivity type.

14. The heterojunction bipolar transistor as claimed in claim 13 wherein the collector region comprises a heavily doped buried collector region of the second conductivity type and a lightly doped sub-collector region of the second conductivity type.

15. The heterojunction bipolar transistor as claimed in claim 14 wherein the intrinsic base structure comprises a compound semiconductive material of silicon and at least one of silicon-germanium, silicon-germanium-carbon, and combinations thereof.

16. A heterojunction bipolar transistor comprising:

a semiconductor substrate of a lightly doped first conductivity type having a collector region of a second conductivity type;

a base contact layer of a heavily doped first conductivity type over the collector region;

the base contact layer and the collector region having a base trench therein;

an intrinsic base structure having a sidewall portion and a bottom portion of a lightly doped first conductivity type in the base trench;

an insulating spacer over the sidewall portion of the intrinsic base structure;

an emitter structure of a heavily doped second conductivity type over the insulating spacer and the bottom portion of the intrinsic base structure;

an interlevel dielectric layer over the base contact layer and the base trench; and connections through the interlevel dielectric layer to the collector region, the base contact layer, and the emitter structure.

17. The heterojunction bipolar transistor as claimed in claim 16 wherein the base contact layer comprises a compound semiconductive material of silicon and at least one of silicon-germanium, silicon-germanium-carbon, and combinations thereof.

18. The heterojunction bipolar transistor as claimed in claim 16 wherein the collector region comprises a heavily doped buried collector region of the second conductivity type and a lightly doped sub-collector region of the second conductivity type.

19. The heterojunction bipolar transistor as claimed in claim 18 wherein the base trench in the collector region comprises a base trench in the sub-collector region.

20. The heterojunction bipolar transistor as claimed in claim 19 wherein the intrinsic base structure comprises a layer of a compound semiconductive material of silicon and at least one of silicon-germanium, silicon-germanium-carbon, and combinations thereof.

* * * * *